(12) United States Patent
Lin

(10) Patent No.: US 8,772,807 B2
(45) Date of Patent: Jul. 8, 2014

(54) LIGHT EMITTING DIODE PACKAGE STRUCTURE AND MANUFACTURING METHOD THEREOF

(75) Inventor: Hsien Chia Lin, New Taipei (TW)

(73) Assignee: Everlight Electronics Co., Ltd. (TW)

( * ) Notice: Subject to any disclaimer, the term of this patent is extended or adjusted under 35 U.S.C. 154(b) by 0 days.

(21) Appl. No.: 13/118,007

(22) Filed: May 27, 2011

(65) Prior Publication Data

US 2012/0080702 A1  Apr. 5, 2012

(30) Foreign Application Priority Data

Sep. 30, 2010  (TW) ............................... 99133380 A

(51) Int. Cl.
*H01L 33/00* (2010.01)

(52) U.S. Cl.
USPC 257/98; 257/99; 257/E33.056; 257/E33.061; 257/33.065; 438/28; 438/29

(58) Field of Classification Search
USPC ............... 257/79–103, E33.001–E33.077, 257/E33.061, E33.062, E33.065, E33.066, 257/E33.055, E33.056, E33.057, E33.071; 438/22–47
See application file for complete search history.

(56) References Cited

U.S. PATENT DOCUMENTS

| | | | |
|---|---|---|---|
| 6,087,194 A | | 7/2000 | Matsukura et al. |
| 6,396,082 B1 * | | 5/2002 | Fukasawa et al. ............. 257/79 |
| 6,630,691 B1 | | 10/2003 | Mueller-Mach et al. |
| 6,696,703 B2 | | 2/2004 | Mueller-Mach et al. |
| 6,746,889 B1 | | 6/2004 | Eliashevich et al. |
| 6,878,971 B2 * | | 4/2005 | Uemura .......................... 257/98 |
| 7,078,737 B2 * | | 7/2006 | Yuri et al. ....................... 257/99 |
| 7,195,944 B2 | | 3/2007 | Tran et al. |
| 7,220,608 B2 * | | 5/2007 | Oohata ........................... 438/28 |
| 7,301,175 B2 | | 11/2007 | Izuno et al. |
| 7,361,938 B2 | | 4/2008 | Mueller et al. |

(Continued)

FOREIGN PATENT DOCUMENTS

| | | |
|---|---|---|
| CN | 101621054 | 1/2010 |
| CN | 101663767 | 3/2010 |

(Continued)

OTHER PUBLICATIONS

Machine translation, Kaneko, Japanese Patent Publication No. 2002-098863, (translation date: Apr. 9, 2014), JPO & Japio, all pages.*

(Continued)

*Primary Examiner* — Fernando L Toledo
*Assistant Examiner* — Victoria K Hall
(74) *Attorney, Agent, or Firm* — Han IP Corporation

(57) ABSTRACT

In one aspect, an LED package structure comprises a fluorescent substrate, a first electrically conductive pattern, a second electrically conductive pattern, at least one electrically conductive element, and an LED chip. The fluorescent substrate has a first surface and a second surface opposite the first surface. The fluorescent substrate comprises a mixture of a fluorescent material and a glass material. The first electrically conductive pattern is disposed on the first surface. The second electrically conductive pattern is disposed on the second surface. The electrically conductive element passes through the fluorescent substrate and connects the first and second electrically conductive patterns. The LED chip is disposed on the second surface and has a light extraction surface that connects the second electrically conductive pattern. The LED chip is electrically coupled to the first electrically conductive pattern via the electrically conductive element.

10 Claims, 16 Drawing Sheets

(56) References Cited

U.S. PATENT DOCUMENTS

| | | | |
|---|---|---|---|
| 7,455,563 B2 * | 11/2008 | Do et al. .................... | 445/23 |
| 7,589,358 B2 * | 9/2009 | Dwilinski et al. ............ | 257/102 |
| 7,622,751 B2 * | 11/2009 | Ishihara ...................... | 257/99 |
| 7,718,449 B2 | 5/2010 | Gao et al. | |
| 7,732,826 B2 * | 6/2010 | Kamiyama et al. ............ | 257/94 |
| 7,985,964 B2 * | 7/2011 | Kamiyama et al. ............ | 257/12 |
| 8,030,105 B1 | 10/2011 | Hsieh | |
| 8,143,632 B2 * | 3/2012 | Imai et al. ................... | 257/89 |
| 8,237,187 B2 | 8/2012 | Huang et al. | |
| 8,338,841 B2 * | 12/2012 | Lerman et al. ............... | 257/88 |
| 2003/0160258 A1 * | 8/2003 | Oohata ....................... | 257/99 |
| 2006/0003477 A1 | 1/2006 | Braune et al. | |
| 2006/0261364 A1 | 11/2006 | Suehiro et al. | |
| 2006/0284207 A1 | 12/2006 | Park et al. | |
| 2007/0202623 A1 | 8/2007 | Gao et al. | |
| 2008/0029780 A1 | 2/2008 | Ohtsuka et al. | |
| 2008/0121911 A1 | 5/2008 | Andrews et al. | |
| 2008/0173884 A1 * | 7/2008 | Chitnis et al. ............... | 257/98 |
| 2008/0179611 A1 | 7/2008 | Chitnis | |
| 2008/0197378 A1 * | 8/2008 | Kong et al. ................. | 257/103 |
| 2009/0057690 A1 | 3/2009 | Chakraborty | |
| 2009/0065790 A1 | 3/2009 | Chitnis et al. | |
| 2009/0080187 A1 * | 3/2009 | Chou ......................... | 362/231 |
| 2009/0140394 A1 * | 6/2009 | Bathan et al. ............... | 257/621 |
| 2009/0174062 A1 | 7/2009 | Mihara | |
| 2009/0197361 A1 | 8/2009 | Braune et al. | |
| 2009/0224273 A1 * | 9/2009 | Sakamoto et al. ............ | 257/98 |
| 2009/0256163 A1 | 10/2009 | Chakraborty | |
| 2009/0273000 A1 * | 11/2009 | Kon ........................... | 257/98 |
| 2010/0032189 A1 * | 2/2010 | Muto et al. ................. | 174/252 |
| 2010/0081220 A1 | 4/2010 | Cheng et al. | |
| 2010/0200886 A1 * | 8/2010 | Krames et al. ............... | 257/98 |
| 2011/0084300 A1 * | 4/2011 | Park ........................... | 257/98 |
| 2011/0215355 A1 * | 9/2011 | van de Ven et al. ......... | 257/98 |
| 2012/0043569 A1 | 2/2012 | Mitsuishi et al. | |
| 2012/0080703 A1 * | 4/2012 | Lin ............................ | 257/98 |
| 2013/0008586 A1 | 1/2013 | Fukuda | |

FOREIGN PATENT DOCUMENTS

| | | |
|---|---|---|
| CN | 101794853 | 8/2010 |
| JP | 05-327224 | 12/1993 |
| JP | 2000-059028 | 2/2000 |
| JP | 2000173954 | 6/2000 |
| JP | 3589187 | 4/2002 |
| JP | 2002-098863 | 5/2002 |
| JP | 2004-128424 | 4/2004 |
| JP | 2004-172578 | 6/2004 |
| JP | 2006-093632 | 6/2006 |
| JP | 2008-004689 | 1/2008 |
| JP | 2009-212281 | 9/2009 |
| JP | 2010-157637 | 7/2010 |
| TW | 200704610 | 2/2007 |

OTHER PUBLICATIONS

Machine translation, Kuzuhara, Japanese Patent Publication No. 2006-093632, (translation date: Apr. 9, 2014), JPO & Japio, all pages.*

USPTO, Non-Final Office Action in U.S. Appl. No. 13/229,994, Apr. 9, 2012, pp. 2-7.

Wu et al., "Effect of Some Factors on Surface Roughness in Point Diamond Turning", Tool Engineering, 2008, Issue # 42, China.

* cited by examiner

LIGHT EMITTING DIODE PACKAGE STRUCTURE AND MANUFACTURING METHOD THEREOF

CROSS-REFERENCE TO RELATED PATENT APPLICATIONS

This application claims priority to Taiwan Patent Application No. 099133380, entitled "Light Emitting Diode Package Structure and Manufacturing Method Thereof", filed on Sep. 30, 2010, which is herein incorporated in its entirety by reference.

BACKGROUND

1. Technical Field

The present disclosure relates to a semiconductor package structure and a manufacturing method thereof. More particularly, the present disclosure relates to a light emitting diode (LED) package structure and a manufacturing method thereof.

2. Description of Related Art

LEDs generally offer a number of advantageous characteristics such as long product life, compact size, high shock resistance, low heat generation and low power consumption, etc. As a result LEDs are widely employed in household applications and as the light source or indicator of a variety of equipment. Recent developments of new LEDs are in the areas of multiple colors and high brightness. Accordingly, LEDs are further employed in applications such as large outdoor bulletin boards, traffic signals and related fields. In the future, LEDs may even become the primary light source for illumination that not only conserve electricity but also are environmentally friendly.

Among the white-light LED package structures commonly adopted in the market, a type of white-light LED is composed of a blue-light LED chip and yellow phosphor. A prior art manufacturing method of a white-light LED package structure typically disposes a blue-light LED chip on a base and wire bonds the blue-light LED chip with the base. Afterwards, using spin coating, dispensing, spray coating, molding or any other suitable process on the base, a yellow fluorescent layer is formed on the blue-light LED chip. A portion of the yellow fluorescent layer emits yellow light upon excitation by the blue light emitted by the blue-light LED chip, and in turn the yellow light, combined with the blue light emitted by the blue-light LED chip, produces white light. However, a yellow fluorescent layer formed by spin coating, dispensing, spray coating or the like tends to suffer from excessive usage of phosphor powder and results in uneven thickness of the layer. That is, when the blue light emitted by the blue-light LED chip traverses through a yellow fluorescent layer of a greater thickness, the white-light LED package structure may produce a yellowish halo, causing the color of the light emitted by the LED package structure to be uneven overall.

In order to address the problem associated with uneven spin-coating of the fluorescent layer, U.S. Pat. No. 6,395,564 and U.S. Patent Publication No. 2009/0261358 disclose a technique that involves spraying the fluorescent layer directly on wafers and forming white-light LED package structures after cutting the wafers. However, such prior art technique suffers from the problem of lowered scattering efficiency during the process of the yellow fluorescent layer emitting yellow light upon excitation by the blue light. Additionally, as difference in wavelengths may result from crystalline growth on wafers, manufacturing costs tend to increase if the difference in wavelengths is to be rectified by way of spin-coating fluorescent layer on wafers.

In order to address the problem associated with low scattering efficiency, U.S. Pat. No. 6,630,691 discloses a manufacturing method of a phosphor layer. Ceramic glass and phosphor are combined under high temperature to result in a eutectic process that forms a fluorescent substrate, which is pasted to LED chips to avoid the issue of low scattering efficiency and enhance the uniformity of light generated by the LED package structure. However, as such prior art technique provides no electrode design for the fluorescent substrate, the use of this technique is limited to flip chip LED chips.

SUMMARY

The present disclosure provides an LED package structure and a manufacturing method thereof that can help enhance the uniformity in the color of light generated by LED chips.

In one aspect, an LED package structure may comprise a fluorescent substrate, a first electrically conductive pattern, a second electrically conductive pattern, at least one electrically conductive component, and an LED chip. The fluorescent substrate may have a first surface and a second surface opposite the first surface. The fluorescent substrate may comprise a fluorescent material and a glass material. The first electrically conductive pattern may be disposed on the first surface of the fluorescent substrate. The second electrically conductive pattern may be disposed on the second surface of the fluorescent substrate. The at least one electrically conductive component may connect the first electrically conductive pattern and the second electrically conductive pattern. The LED chip may be disposed on the second surface of the fluorescent substrate. The LED chip may have a light extraction surface coupled to the second electrically conductive pattern such that the LED chip is electrically coupled to the first electrically conductive pattern via the at least one electrically conductive component.

In one embodiment, a thickness of the fluorescent substrate may be approximately constant throughout the fluorescent substrate.

In one embodiment, the fluorescent material may comprise yellow phosphor.

In one embodiment, the fluorescent material may comprise phosphors of at least two different wavelengths.

In one embodiment, the phosphors may comprise at least two of yellow phosphor, red phosphor, and green phosphor.

In one embodiment, the LED package structure may further comprise an underfill disposed between the light extraction surface of the LED chip and the second surface of the fluorescent substrate, the underfill covering at least partially the light extraction surface of the LED chip. In one embodiment, the underfill may cover a plurality of side surfaces of the LED chip. In one embodiment, the LED chip may comprise a sapphire substrate.

In one embodiment, the LED package structure may further comprise a circuit line substrate where a back surface of the LED chip opposite the light extraction surface is disposed on the circuit line substrate. In one embodiment, the LED package structure may further comprise at least one bonding wire that electrically couples the circuit line substrate and the first electrically conductive pattern.

In another aspect, a manufacturing method of an LED package structure may comprise: providing a fluorescent substrate having a first surface and a second surface opposite the first surface, the fluorescent substrate containing therein a plurality of electrically conductive components that connect the first surface and the second surface, the fluorescent substrate comprising a mixture of at least one fluorescent material and a glass material; forming a first electrically conductive pattern on the first surface and a second electrically conductive pattern on the second surface, at least some of the electrically conductive components connecting the first electrically conductive pattern and the second electrically conductive pattern; and bonding a plurality of LED chips on the second surface of the fluorescent substrate, each of the LED chips having a respective light extraction surface coupled to the second electrically conductive pattern, each of the LED chips electrically coupled to the first electrically conductive pattern via a corresponding one of the electrically conductive components.

In one embodiment, the plurality of electrically conductive components may be formed by: forming a plurality of through holes in the fluorescent substrate, the through holes connecting the first surface and the second surface; galvanizing the through holes to form a plurality of electrically conductive pillars protruding out of the first surface of the fluorescent substrate; milling the electrically conductive pillars to provide the electrically conductive components that are flush with the first surface of the fluorescent substrate. In one embodiment, the milling comprises cutting the fluorescent substrate with a cutting device to reduce a thickness of the fluorescent substrate and to expose the electrically conductive components.

In one embodiment, the plurality of electrically conductive components may be formed by: forming a plurality of electrically conductive bumps in a recess of a carrier base; filling the recess of the carrier base with the at least one fluorescent material and the glass material, the at least one fluorescent material and the glass material covering the electrically conductive bumps; heating the electrically conductive bumps, the at least one fluorescent material, and the glass material together to form the fluorescent substrate with the electrically conductive bumps buried therein; and milling the fluorescent substrate and the electrically conductive bumps to form the electrically conductive components that are flush with the first surface of the fluorescent substrate.

In one embodiment, the method may further comprise: forming a plurality of circuit lines on the second surface after forming the second electrically conductive pattern, the circuit lines connecting the second electrically conductive pattern.

In one embodiment, the method may further comprise: forming an underfill between the light extraction surface of the LED chips and the second surface of the fluorescent substrate after bonding the LED chips on the second surface of the fluorescent substrate, the underfill covering at least partially the light extraction surface of the LED chips. In one embodiment, the method may additionally comprise: after forming the underfill, carrying out a cutting process to form a plurality of LED package structures. In one embodiment, the underfill may cover at least partially a plurality of side surfaces of the LED chips. In one embodiment, the method may also comprise: after forming the underfill, carrying out a cutting process to form a plurality of LED package structures.

These and other features, aspects, and advantages of the present disclosure will be explained below with reference to the following figures. It is to be understood that both the foregoing general description and the following detailed description are by examples, and are intended to provide further explanation of the present disclosure as claimed.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE PREFERRED EMBODIMENTS

Figure 1A:
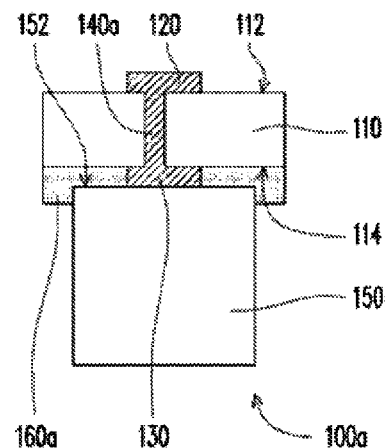
FIG. 1A illustrates a cross-sectional view of an LED package structure in accordance with an embodiment of the present disclosure.

FIG. 1A illustrates a cross-sectional view of an LED package structure in accordance with an embodiment of the present disclosure. Referring to FIG. 1A, in one embodiment, the LED package structure 100a comprises a fluorescent substrate 110, a first electrically conductive pattern 120, a second electrically conductive pattern 130, at least one electrically conductive component 140a (only one being representatively illustrated in FIG. 1A), and an LED chip 150.

More specifically, the fluorescent substrate 110 comprises two opposite surfaces: a first surface 112 and a second surface 114. In one embodiment, the fluorescent substrate 110 is composed of, for example, a mixture of a fluorescent material and a glass material. The fluorescent substrate 110 generally has a uniform thickness throughout. The first electrically conductive pattern 120 is disposed on the first surface 112 of the fluorescent substrate 110. It will be appreciated that, although in one embodiment the fluorescent material of the fluorescent substrate 110 may be, for example, a yellow fluorescent material, there are other types of fluorescent material and fluorescent materials of two or more different colors may be utilized. For example, yellow phosphor and red phosphor may be combined, green phosphor and red phosphor may be combined, and so on. In addition, the second electrically conductive pattern 130 is disposed on the second surface 114 of the fluorescent substrate 110. The electrically conductive component 140a traverses through the fluorescent substrate 110, connecting the first electrically conductive pattern 120 and the second electrically conductive pattern 130. The LED chip 150 is disposed on a side of the second surface 114 of the fluorescent substrate 110 and has a light extraction surface 152 which is connected to the second electrically conductive pattern 130. This allows the LED chip 150 to be electrically coupled to an external component (not illustrated) via an electrically conductive path formed by the second electrically conductive pattern 130, the electrically conductive component 140a, and the first electrically conductive pattern 120. It shall be appreciated that, although the LED chip 150 in one embodiment may be a vertical emission LED chip, other LED chips with equivalent light emission characteristics are also within the scope of the present disclosure. For example, high-voltage LED chips or alternating current (AC) LED chips are also applicable.

Noticeably, with the fluorescent substrate 110 electrically coupled to the LED chip 150 via the electrically conductive component 140a, the electrically conductive component 140a allows a maximized density of three-dimensional stacking and minimized dimensions of the LED chip 150. Accordingly, signals between the fluorescent substrate 110 and the LED chip 150 can be passed through the electrically conductive component 140a, resulting in increased component speed, reduced signal delay, and lower power consumption.

In another embodiment, the LED package structure 110a further comprises an underfill 160a. The underfill 160a is disposed between the light extraction surface 152 of the LED chip 150 and the second surface 114 of the fluorescent substrate 110. Preferably, the underfill 160a covers the light extraction surface 152 of the LED chip 150. In one embodiment, functions of the underfill 160a include protecting the light extraction surface 152 of the LED chip 150 and avoiding total reflection of the light emitted by the LED chip 150 in the gap between the fluorescent substrate 110 and the LED chip 150, thereby enhancing the illumination efficiency of the LED package structure 100a. In one embodiment, the underfill 160a is made of a material that comprises epoxy such as, for example and not limited to, silicone or silica gel, epoxy resin, or a compound thereof. In other embodiments, the underfill 160a may further comprise a fluorescent material as an additive that is different than the fluorescent material in the fluorescent substrate 110. For instance, when the fluorescent substrate 110 comprises a yellow fluorescent material, the fluorescent material of the underfill 160a may comprise red phosphor. As another example, when the fluorescent substrate 110 comprises a green/red fluorescent material, the fluorescent material of the underfill 160a may comprise red phosphor/green phosphor. In this way, the color saturation of the LED package structure 110a can be enhanced.

Given that in one embodiment each LED chip 150 is configured to be used with the fluorescent substrate 110 that comprises a mixture of a fluorescent material and a glass material, that the first electrically conductive pattern 120, the second electrically conductive pattern 130 and the electrically conductive component 140 are disposed on the fluorescent substrate 110, and that each LED chip 150 is a selected one that generates a desired wavelength, a plurality of such LED chips 150 can thus produce light with wavelengths that fall within the same range. Furthermore, as the fluorescent substrate 110 of the LED package structure has a uniform thickness, light emitted by the LED chip 150 passing through the fluorescent substrate 110 can be converted into a light with high uniformity. A plurality of such LED package structures can thus produce white light with wavelengths that fall within approximately the same range. In other words, the LED package structure 110a according to the present disclosure can produce light with better uniformity.

In the following description of other embodiments, the same numeral references will be used for the same components as described above and detailed description thereof will not be repeated in the interest of brevity as reference can be made to the embodiments described above.

Figure 1B:
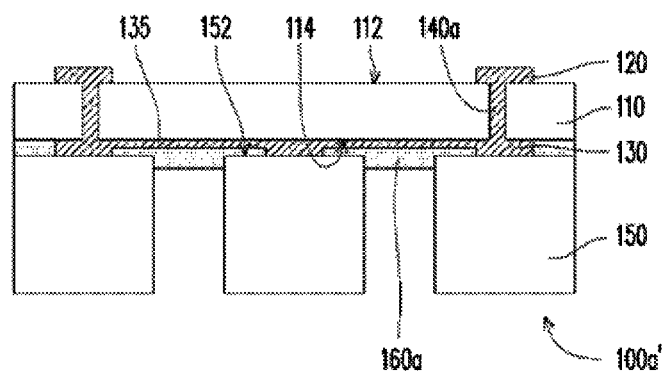
FIG. 1B illustrates a cross-sectional view of an LED package structure in accordance with another embodiment of the present disclosure.

FIG. 1B illustrates a cross-sectional view of an LED package structure in accordance with another embodiment of the present disclosure. Referring to FIGS. 1A and 1B, the LED package structure 100a' of FIG. 1B and the LED package structure 100a of FIG. 1A are similar with one main difference being that in the LED package structure 100a' of FIG. 1B a plurality of circuit lines 135 are disposed on the second surface 114 of the fluorescent substrate 110. In the illustrated embodiment, the LED package structure 100a' comprises a plurality of first electrically conductive patterns 120, a plurality of second electrically conductive patterns 130, a plurality of electrically conductive components 140, and a plurality of LED chips 150.

In one embodiment, with the circuit lines 135 on the second surface 114 of the fluorescent substrate 110, the second electrically conductive patterns 130 associated with the LED chips 150 are electrically coupled to one another via the circuit lines 135, and a variety of circuit designs can be configured depending on the needs. That is, depending on the needs of a user of the LED package structure 100a', there can be different circuit designs configured and implemented on the fluorescent substrate 110 to allow the user to efficiently achieve the desired results having the LED chips 150 connected in series or in parallel.

Figure 1C:
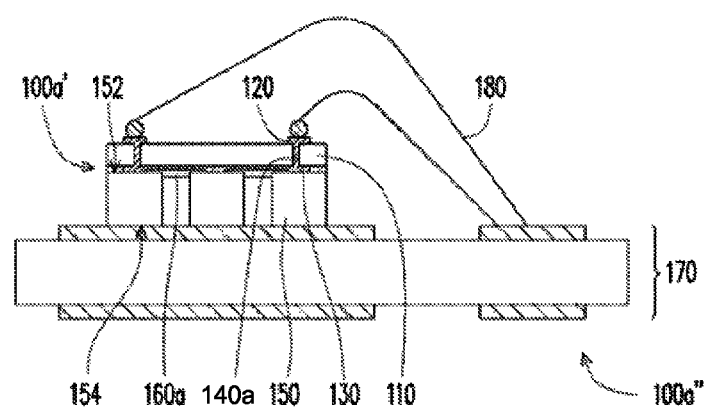
FIG. 1C illustrates a cross-sectional view of an LED package structure in accordance with yet another embodiment of the present disclosure.

FIG. 1C illustrates a cross-sectional view of an LED package structure in accordance with yet another embodiment of the present disclosure. Referring to FIGS. 1B and 1C, the LED package structure 100a" of FIG. 1C and the LED package structure 100a' of FIG. 1B are similar with one main difference being that the LED package structure 100a" of FIG. 1C further comprises a circuit line substrate 170 and at least one bonding wire 180. The actual number of bonding wires 180 is not limited to that illustrated in FIG. 1C and is determined according to the actual circuit implemented on the fluorescent substrate 110. The LED package structure 100a" of the illustrated embodiment is disposed on the circuit line substrate 170, and a back surface 154 opposite the light extraction surface 152 of each of the LED chips 150 is disposed on the circuit line substrate 170. The LED package structure 100a" is electrically coupled to the first electrically conductive patterns 120 and the circuit line substrate 170 via the bonding wires 180. As such, the LED chips 150 can be electrically coupled to an external circuit (not illustrated) via the circuit line substrate 170, thereby increasing the applicability of the LED package structure 100a".

Figure 2A:
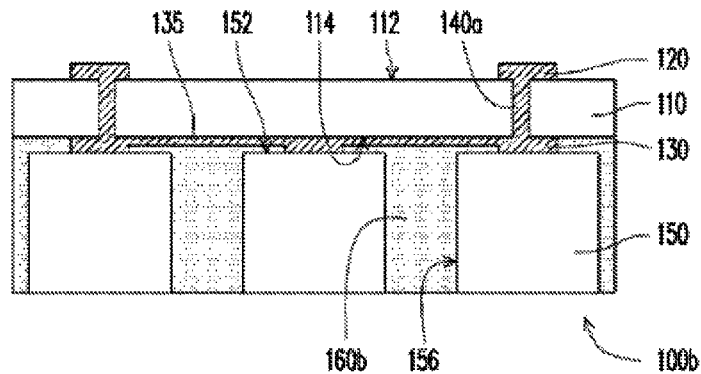
FIG. 2A illustrates a cross-sectional view of an LED package structure in accordance with still another embodiment of the present disclosure.

FIG. 2A illustrates a cross-sectional view of an LED package structure in accordance with still another embodiment of the present disclosure. Referring to FIGS. 2A and 1B, the LED package structure 100b of FIG. 2A and the LED package structure 100a' of FIG. 1B are similar with one main difference being that in the LED package structure 100b of FIG. 2A the underfill 160b is extended to at least partially cover a plurality of side surfaces 156 of the LED chips 150. In the illustrated embodiment, the LED chips 150 may each comprise a sapphire substrate, leakage of light or total reflection can be avoided with the side surfaces 156 of the LED chips 150 covered by the underfill 160a. This enhances the illumination efficiency of the LED package structure 100b.

Figure 2B:
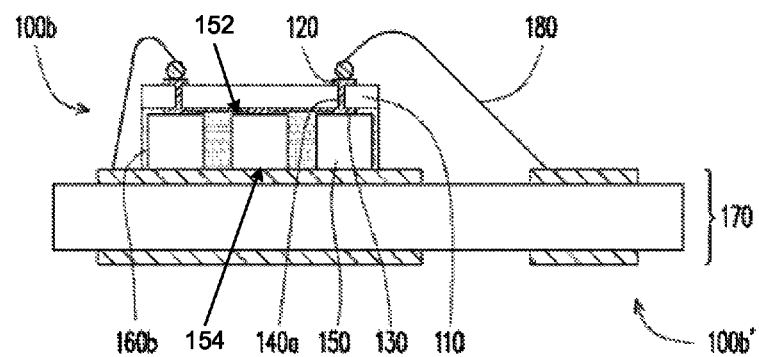
FIG. 2B illustrates a cross-sectional view of an LED package structure in accordance with a further embodiment of the present disclosure.

FIG. 2B illustrates a cross-sectional view of an LED package structure in accordance with a further embodiment of the present disclosure. Referring to FIGS. 2A and 2B, the LED package structure 100b' of FIG. 2B and the LED package structure 100b of FIG. 2A are similar with one main difference being that the LED package structure 100b' of FIG. 2B further comprises a circuit line substrate 170 and at least one bonding wire 180 (only two being illustrated in FIG. 2B). A back surface 154 opposite the light extraction surface 152 of each of the LED chips 150 is disposed on the circuit line substrate 170. The circuit line substrate 170 is electrically coupled to the first electrically conductive patterns 120 via the bonding wires 180. As such, the LED chips 150 can be electrically coupled to an external circuit (not illustrated) via the circuit line substrate 170, thereby increasing the applicability of the LED package structure 100b'.

The above description introduces embodiments of LED package structure 100a, 100a', 100a", 100b and 100b'. The detailed description that follows is directed to embodiments of a manufacturing process of an LED package structure in accordance with the present disclosure, using the LED package structure 100a, 100a' of FIGS. 1A and 1B as examples and with reference to FIGS. 3A-3I, 4A-4D and 5A-5D.

Figure 3A:
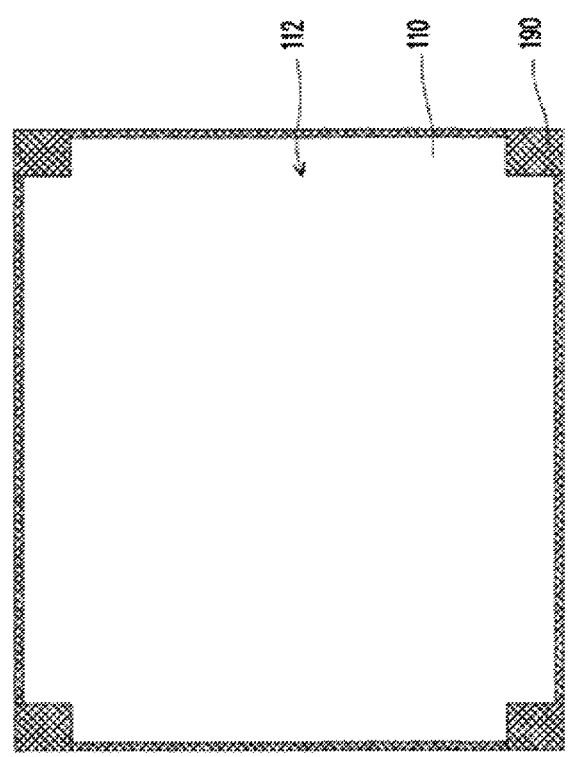
FIGS. 3A through 3I illustrate a process of manufacturing an LED package structure in accordance with an embodiment of the present disclosure.
Figure 3B:
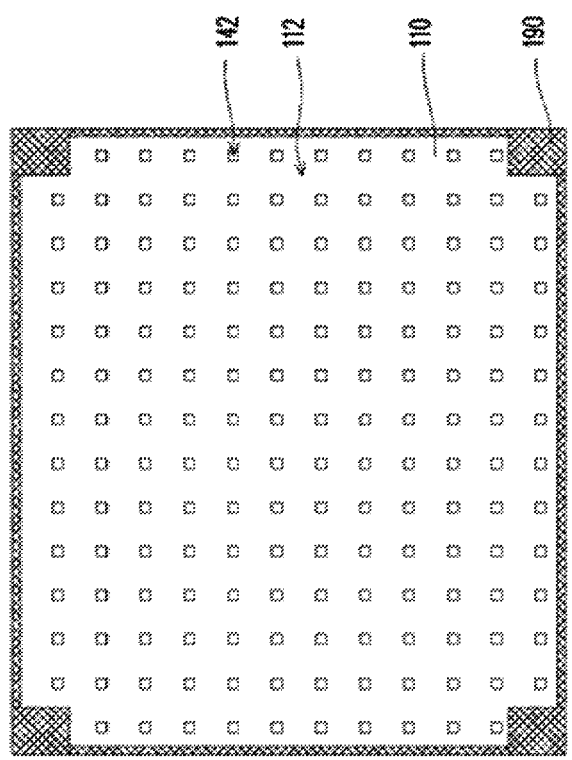
Figure 3C:
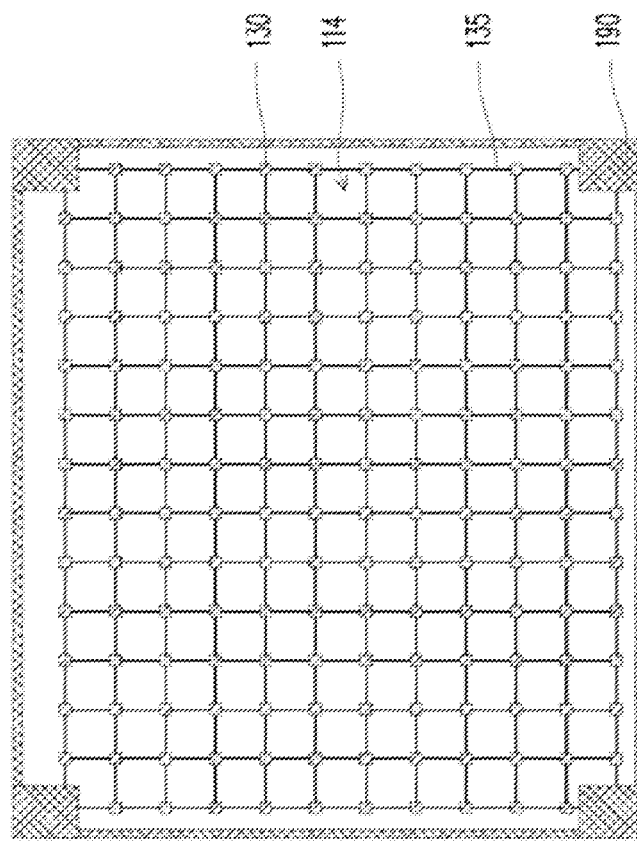
Figure 3D:
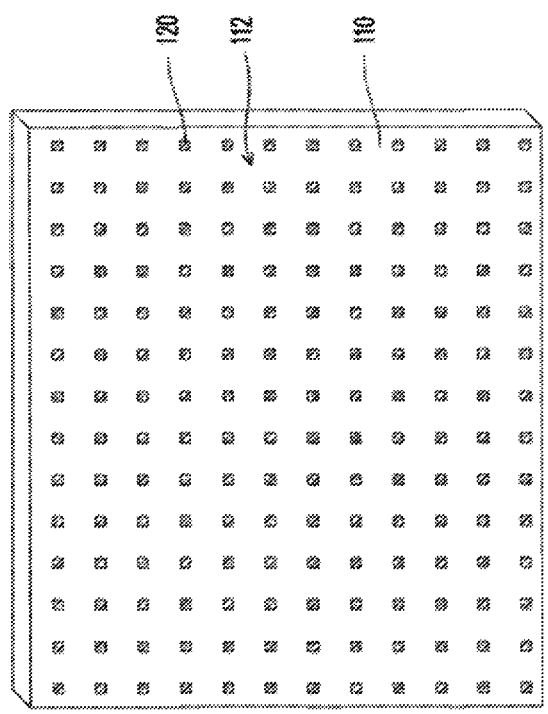
Figure 3E:
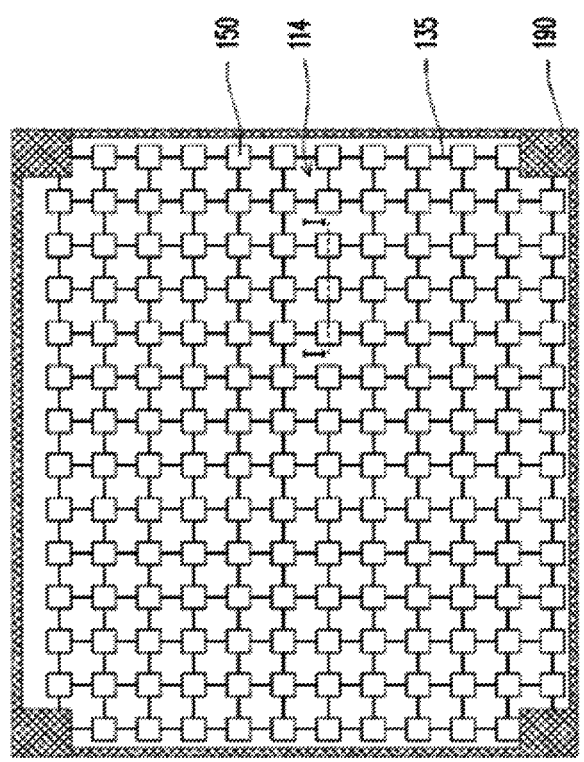
Figure 3F:
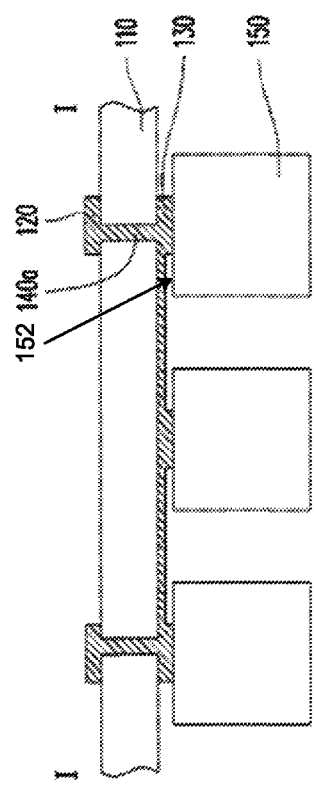
Figure 3G:
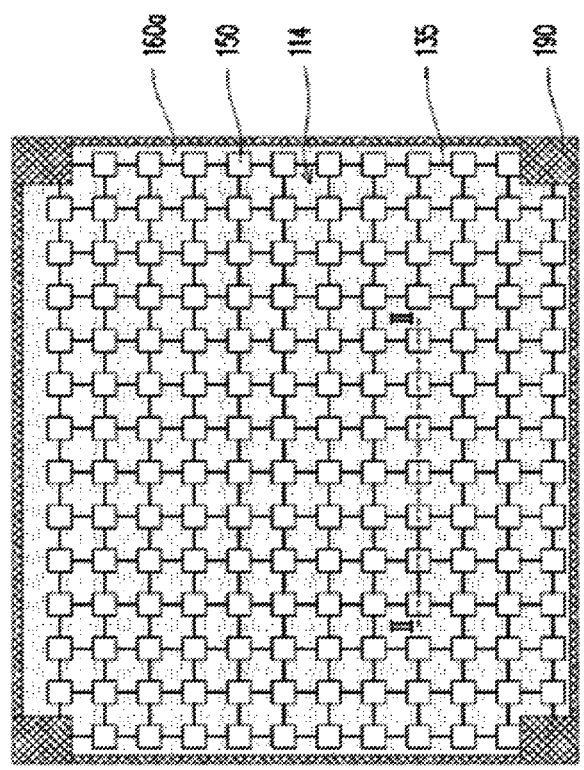
Figure 3H:
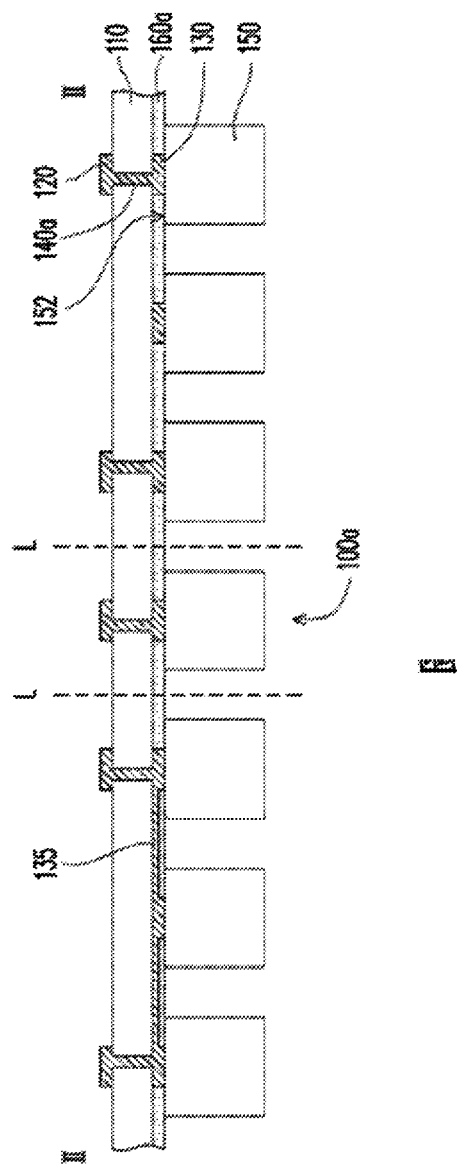
Figure 3I:
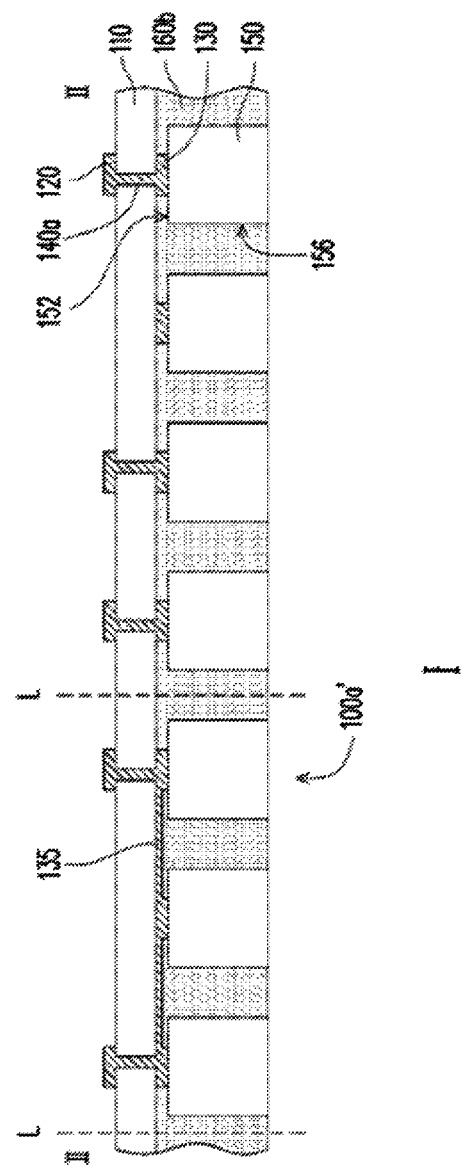

FIGS. 3A through 3I illustrate a process of manufacturing an LED package structure in accordance with an embodiment of the present disclosure. FIGS. 4A through 4D illustrate a process of manufacturing of an electrically conductive component in accordance with an embodiment of the present disclosure. FIGS. 5A through 5D illustrate a process of manufacturing of an electrically conductive component in accordance with another embodiment of the present disclosure. For convenience of illustration and description, carrier base 190 is omitted in FIG. 3D, FIG. 3F is a cross-sectional view along the line I-I in FIG. 3E, and FIGS. 3H and 3I are each a cross-sectional view along the line II-II in FIG. 3G.

Referring to FIG. 3A, according to an embodiment of a manufacturing process of an LED package structure, a fluorescent substrate 110 and a carrier base 190 are provided. The carrier base 190 is configured to carry the fluorescent substrate 110. The fluorescent substrate 110 comprises two opposite surfaces: a first surface 112 and a second surface 114 (referring to FIG. 3C). In one embodiment, the fluorescent substrate 110 is formed by mixing at least one fluorescent material and a glass material under high temperature. Optionally, during this high-temperature mixing process, a protruding structure may be formed on the fluorescent substrate such as, for example, convex surface, conical surface, trapezoidal protrusions or the like, to thereby enhance efficiency in light extraction and allow designs of angles for light extraction.

Figure 4A:
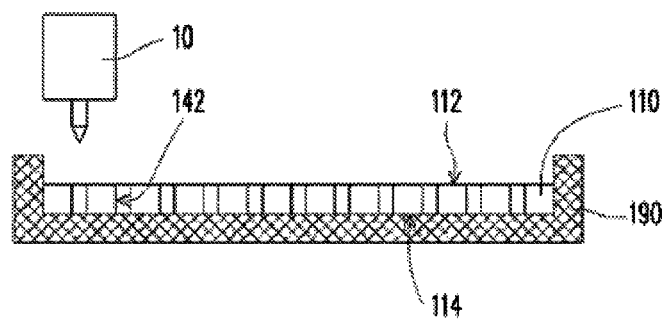
FIGS. 4A through 4D illustrate a process of manufacturing of an electrically conductive component in accordance with an embodiment of the present disclosure.
Figure 4B:
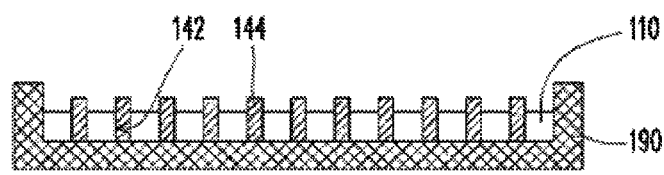
Figure 4C:
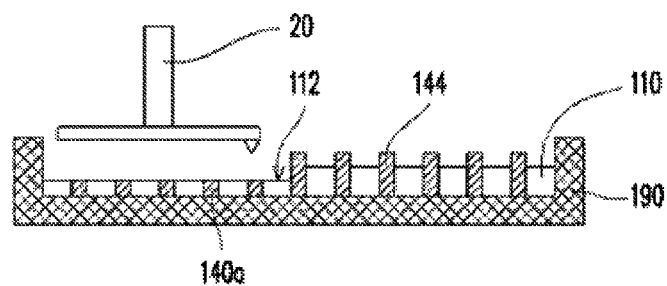
Figure 4D:
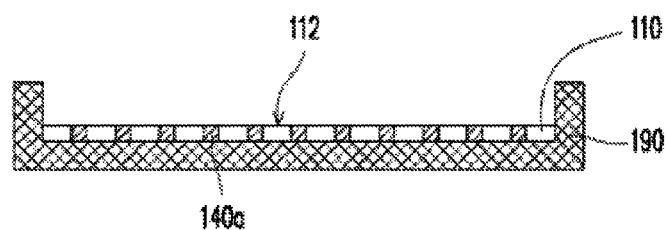

Turning now to FIGS. 3B and 4A, a plurality of through holes 142 are formed in the fluorescent substrate 110 and connect the first surface 112 and the second surface 114. In one embodiment, the through holes 142 are formed with a machine tool 10 that carries out a laser drilling process or a mechanical drilling process on the fluorescent substrate 110. Afterwards, referring to FIG. 4B, a galvanization process is carried out to form a plurality of electrically conductive pillars 144 in the through holes 142 and protruding out of the first surface 112 of the fluorescent substrate 110. Referring to FIGS. 4C and 4D, a milling process is carried out on the fluorescent substrate 110 such that the fluorescent substrate 110 and the electrically conductive pillars 144 are milled to result in the first surface 112 with trimmed and flush electrically conductive components 140a. Preferably, the milling process is carried out through a machine tool 20 such as, for example, a diamond cutter machine, by cutting the fluorescent substrate 110 with a diamond cutter in a clockwise spin direction and by moving the carrier base 190 that carries the fluorescent substrate 110 in a first direction. In other words, when the diamond cutter cuts by spinning, the carrier base moves with respect to the diamond cutter. Of course, the present disclosure is not limited to any direction of spin of the diamond cutter or any direction of movement by the carrier base 190 and the fluorescent substrate 110. For example, in some embodiments the diamond cutter may spin in a counter-clockwise direction.

The machine tool 20 reduces the thickness of the fluorescent substrate 110 as well as trims the electrically conductive components 140a to be flush with the first surface 112. This is beneficial for subsequent steps of the manufacturing process. As the fluorescent substrate 110 is thinned to a generally uniform thickness throughout, light extraction efficiency of the components can be greatly enhanced. In one embodiment, after thinning, the fluorescent substrate 110 has a thickness approximately in the range of 10 μm-500 μm. Preferably, the thickness is in the range of 10 μm-150 μm.

Figure 5A:
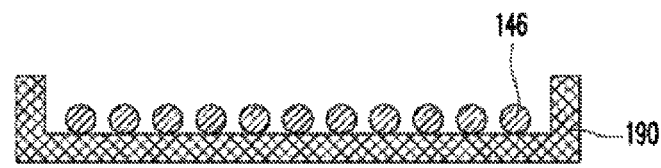
FIGS. 5A through 5D illustrate a process of manufacturing of an electrically conductive component in accordance with another embodiment of the present disclosure.
Figure 5B:
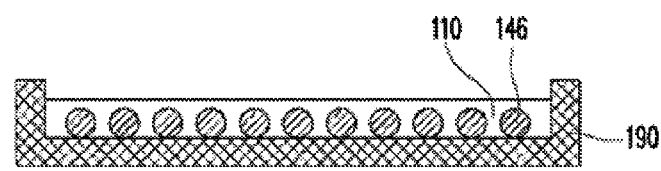
Figure 5C:
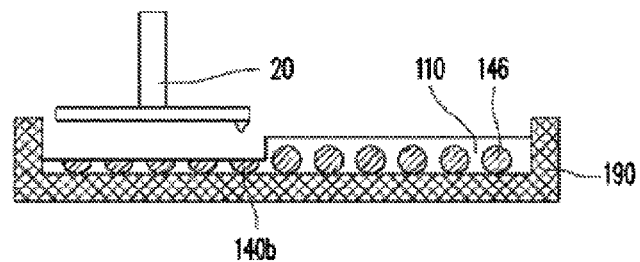
Figure 5D:
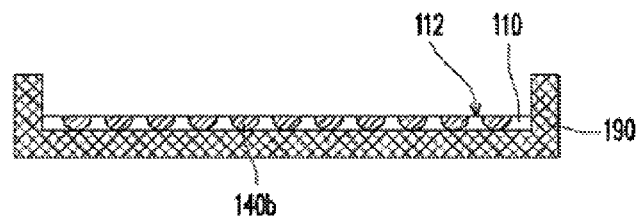

In other embodiments, the electrically conductive components may be implemented in another form factor. Referring to FIG. 5A, a plurality of electrically conductive bumps 146 are formed in a recess of the carrier base 190. The material of the electrically conductive bumps 146 may be, for example but not limited to, gold. Next, referring to FIG. 5B, a fluorescent material (not illustrated) and a glass material (not illustrated) are filled in the recess of the carrier base 190. The fluorescent material and the glass material cover up the electrically conductive bumps 146. The fluorescent material comprises at least a type of phosphor. Afterwards, the electrically conductive bumps 146, the fluorescent material and the glass material together are placed under high temperature to form the fluorescent substrate 110 with the electrically conductive bumps 146 buried therein. Lastly, referring to FIGS. 5C and 5D, a milling process is carried out on the fluorescent substrate 110 and the electrically conductive bumps 146 to form the electrically conductive components 140b that are flush with the first surface 112 of the fluorescent substrate 110. The milling process is similar to that shown in FIGS. 4A-4C and will not be described again in the interest of brevity. After the machine tool 20 cuts the electrically conductive bumps 146 and/or the first surface 112 of the fluorescent substrate 110, the thickness of the fluorescent substrate 110 is reduced and the electrically conductive components 140b are flush with the first surface 112 of the thinned fluorescent substrate 110. After thinning, the fluorescent substrate 110 preferably has a thickness approximately in the range of 10 μm-500 μm. Preferably, the thickness is in the range of 10 μm-150 μm.

Noticeably, in the present disclosure, the diamond cutter is spinning when cutting the fluorescent substrate 110 and the electrically conductive pillars 144. The spinning of the diamond cutter allows a very tiny tip of the diamond cutter to turn a cutting point into a cutting line and eventually a cutting surface with the relative movement between the fluorescent substrate 110 and the diamond cutter. Accordingly, the first surface 112 of the fluorescent substrate 110, having been cut by the diamond cutter, tends to have a rough surface with scale patterns thereon. Consequently, total reflection of the light emitted by the LED chips 150 (referring to FIG. 1A) can be avoided, and the illumination efficiency of the LED package structure 100a (FIG. 1A) and 100a' (FIG. 1B) can be enhanced.

Referring to FIGS. 3C and 3D, the first electrically conductive pattern 120 is formed on the first surface 112 of the fluorescent substrate 110 and the second electrically conductive pattern 130 is formed on the second surface 114 of the fluorescent substrate 110. The electrically conductive components 140a electrically connect the first electrically conductive pattern 120 and the second electrically conductive pattern 130 (FIG. 3F). Noticeably, after the second electrically conductive pattern 130 is formed, the plurality of circuit lines 135 that connect the second electrically conductive pattern 130 are formed on the second surface 114 of the fluorescent substrate 110. Optionally, a second electrically conductive pattern 130 may be electrically coupled to a corresponding second electrically conductive pattern 130 via the circuit lines 135 to form different electrical circuits.

Referring to FIGS. 3E and 3F, a plurality of LED chips 150 are flip chip bonded to the second surface 114 of the fluorescent substrate 110. Each LED chip 150 comprises a light extraction surface 152 that is coupled to a respective first electrically conductive pattern 120. Each LED chip 150 is electrically coupled to a respective first electrically conductive pattern 120 via a corresponding electrically conductive component 140a. In other embodiments, based on the needs of actual implementations, the LED chips 150 may be coupled in series or in parallel depending on the design of the electrical circuit formed on the fluorescent substrate 110.

Referring to FIGS. 3G and 3H, an underfill 160a is formed between the light extraction surface 152 of the LED chips 150 and the second surface 114 of the fluorescent substrate 110. In one embodiment, the underfill 160a covers at least partially the light extraction surface 152 of the LED chips 150.

Referring to FIG. 3H, a cutting process is carried out along a plurality of cutting lines L to form a plurality of LED package structures such as, for example, the LED package structures 100a. At this point the manufacturing process of the LED package structure 100a is complete.

In another embodiment, referring to FIG. 3I, the underfill 160b may be extended to cover a plurality of side surfaces 156 of the LED chips 150. When at least some of the LED chips 150 each comprises a sapphire substrate, by the underfill 160b covering the side surfaces 156 of the LED chips 150 total reflection of light emitted by the LED chips 150 between a gap between the fluorescent substrate 110 and the LED chips 150 can be avoided. This enhances the illumination efficiency of the LED package structure 100b. Afterwards, a cutting process is carried out along a plurality of cutting lines L to form a plurality of LED package structures such as, for example, the LED package structure 100a'. At this point the manufacturing process of the LED package structure 100a' is complete.

The manufacturing processes of the LED package structures 100a, 100a' as illustrated in FIGS. 3A-3I are for illustrative purposes, and certain steps described herein may be existing techniques used in the packaging process. One ordinarily skilled in the art can adjust, skip or add possible step(s) depending on the actual needs in implementation. Moreover, the present disclosure is not limited to the forms of the LED package structures 100a, 100a', 100a", 100b and 100b'. One ordinarily skilled in the art can use or modify the described embodiments depending on the actual needs in implementation to achieve the desired technical effect.

In view of the above description, an LED package structure according to the present disclosure may comprise a fluorescent substrate made from a mixture of one or more fluorescent and glass materials, with electrically conductive patterns and electrically conductive components formed thereon. The fluorescent substrate has a generally uniform thickness. The wavelengths produced by the LED chips are approximately the same. A light of high uniformity in color can be generated by emitting light from the LED chips through the fluorescent substrate. Consequently, an LED package structure that is capable of emitting white light within approximately the same range of wavelengths can be obtained. Relative to prior art methods of manufacturing of fluorescent layers, the present disclosure avoids excessive use of fluorescent materials, thereby reducing manufacturing costs and enhancing the illumination efficiency of the LED package structure. Additionally, as the fluorescent substrate is electrically coupled to the LED chips via the electrically conductive components, signals between the fluorescent substrate and the LED chips can be transmitted through the electrically conductive components. This resultantly increases component speed, reduces signal delay, and lowers power consumption.

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. A light emitting diode (LED) package structure, comprising:
    a fluorescent substrate having a first surface and a second surface opposite the first surface, the fluorescent substrate comprising a fluorescent material and a glass material, the fluorescent substrate having a through hole that traverses through the fluorescent substrate from the first surface to the second surface;
    a first electrically conductive pattern disposed on the first surface of the fluorescent substrate;
    a second electrically conductive pattern disposed on the second surface of the fluorescent substrate;
    an electrically conductive component filled in the through hole and connecting the first electrically conductive pattern and the second electrically conductive pattern; and
    a plurality of LED chips including first and second LED chips disposed on the second surface of the fluorescent substrate with the first LED chip aligned with the through hole and the second LED chip not aligned with the through hole, each of the first and second LED chips having a light extraction surface coupled to the second electrically conductive pattern such that the first and second LED chips are electrically coupled to the first electrically conductive pattern via the second electrically conductive pattern and the electrically conductive component.

2. The LED package structure of claim 1, wherein a thickness of the fluorescent substrate is approximately constant throughout the fluorescent substrate.

3. The LED package structure of claim 1, wherein the fluorescent material comprises yellow phosphor.

4. The LED package structure of claim 1, wherein the fluorescent material comprises phosphors of at least two different wavelengths.

5. The LED package structure of claim 4, wherein the phosphors comprise at least two of yellow phosphor, red phosphor, and green phosphor.

6. The LED package structure of claim 1, further comprising an underfill disposed between the light extraction surface of the first and second LED chips and the second surface of the fluorescent substrate, the underfill covering at least partially the light extraction surface of the first and second LED chips.

7. The LED package structure of claim 6, wherein the underfill covers a plurality of side surfaces of the first and second LED chips partially and not completely.

8. The LED package structure of claim 7, wherein the first and second LED chip comprise a sapphire substrate.

9. The LED package structure of claim 1, further comprising a circuit line substrate, a back surface of each of the first and second LED chips opposite the light extraction surface disposed on the circuit line substrate.

10. The LED package structure of claim 9, further comprising at least one bonding wire that electrically couples the circuit line substrate and the first electrically conductive pattern.

* * * * *